US008971038B2

(12) United States Patent
Sharaf et al.

(10) Patent No.: US 8,971,038 B2
(45) Date of Patent: Mar. 3, 2015

(54) COLDPLATE FOR USE IN AN ELECTRIC VEHICLE (EV) OR A HYBRID-ELECTRIC VEHICLE (HEV)

(75) Inventors: Nadir Sharaf, Bloomfield Township, MI (US); Dilip Daftuar, West Bloomfield, MI (US); George Kaminski, Livonia, MI (US); Venkat Yalamanchili, Farmington Hills, MI (US); Richard J. Hampo, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 340 days.

(21) Appl. No.: 13/477,652

(22) Filed: May 22, 2012

(65) Prior Publication Data
US 2013/0312931 A1 Nov. 28, 2013

(51) Int. Cl.
*F28F 9/007* (2006.01)
*H05K 7/20* (2006.01)
*G06F 1/20* (2006.01)
*H02M 3/28* (2006.01)

(52) U.S. Cl.
USPC ...... 361/679.54; 361/702; 361/704; 361/705; 361/707; 361/715; 165/80.2; 165/80.3; 165/104.33; 165/185; 307/9.1; 307/10.1; 307/43; 363/64; 363/141

(58) Field of Classification Search
USPC .......... 361/679.46, 679.53, 679.54, 702, 704, 361/705, 707, 709, 710, 712, 714, 715, 718, 361/721–724, 734, 760, 766, 768; 165/80.2, 80.3, 80.4, 80.5, 104.33, 165/104.34, 67, 185; 257/706–727; 174/15.1, 16.3, 252; 363/64, 65, 56.02, 363/141–147, 137; 307/9.1, 10.1, 11, 38, 307/43, 82, 115
See application file for complete search history.

(56) References Cited

U.S. PATENT DOCUMENTS

| 3,604,082 A | | 9/1971 | McBrayer et al. |
| 3,622,846 A | | 11/1971 | Reimers |
| 3,656,035 A | | 4/1972 | Corman et al. |
| 3,660,353 A | | 4/1972 | Corman et al. |
| 4,628,407 A | * | 12/1986 | August et al. ................. 361/711 |
| 4,670,814 A | | 6/1987 | Matsui et al. |
| 4,872,102 A | | 10/1989 | Getter |
| 5,091,823 A | | 2/1992 | Kanbara et al. |

(Continued)

FOREIGN PATENT DOCUMENTS

| CN | 2742712 | 11/2005 |
| CN | 101606210 | 12/2009 |

(Continued)

*Primary Examiner* — Michail V Datskovskiy
(74) *Attorney, Agent, or Firm* — Brooks Kushman P.C.

(57) ABSTRACT

A coldplate for use with electronic components in an electric vehicle (EV) or a hybrid-electric vehicle (HEV). The coldplate includes a main portion having multiple raised features on a surface thereof. The raised features are configured for attaching the main portion to a printed circuit board having multiple electronic components attached thereto. The raised features are further configured for maintaining the printed circuit board in a spaced relation relative to the main portion to facilitate air flow between the printed circuit board and the main portion for dissipating heat generated by the plurality of electronic components. The coldplate also includes a protrusion extending from the surface of the main portion. The protrusion is configured for contacting one of the plurality of electronic components attached to the printed circuit board for dissipating heat generated by the electronic component.

20 Claims, 4 Drawing Sheets

(56) References Cited

U.S. PATENT DOCUMENTS

| | | | |
|---|---|---|---|
| 5,239,443 A | 8/1993 | Fahey et al. | |
| 5,367,437 A | 11/1994 | Anderson | |
| 5,408,209 A * | 4/1995 | Tanzer et al. | 336/60 |
| 5,469,124 A | 11/1995 | O'Donnell et al. | |
| 5,498,030 A | 3/1996 | Hill et al. | |
| 5,504,655 A | 4/1996 | Underwood et al. | |
| 5,634,262 A | 6/1997 | O'Donnell et al. | |
| 5,740,015 A | 4/1998 | Donegan et al. | |
| 5,749,597 A | 5/1998 | Saderholm | |
| 5,940,263 A | 8/1999 | Jakoubovitch | |
| 5,949,191 A * | 9/1999 | Cassese et al. | 315/82 |
| 5,973,923 A * | 10/1999 | Jitaru | 361/704 |
| 6,031,751 A | 2/2000 | Janko | |
| 6,045,151 A | 4/2000 | Wu | |
| 6,087,916 A | 7/2000 | Kutkut et al. | |
| 6,144,276 A | 11/2000 | Booth | |
| 6,201,701 B1 * | 3/2001 | Linden et al. | 361/720 |
| 6,206,466 B1 | 3/2001 | Komatsu | |
| 6,222,733 B1 * | 4/2001 | Gammenthaler | 361/705 |
| 6,262,891 B1 | 7/2001 | Wickelmaier et al. | |
| 6,313,991 B1 | 11/2001 | Nagashima et al. | |
| 6,326,761 B1 | 12/2001 | Tareilus | |
| 6,386,577 B1 | 5/2002 | Kan et al. | |
| 6,430,024 B1 | 8/2002 | Gernert | |
| 6,450,528 B1 | 9/2002 | Suezawa et al. | |
| 6,466,441 B1 | 10/2002 | Suzuki | |
| 6,529,394 B1 | 3/2003 | Joseph et al. | |
| 6,819,561 B2 | 11/2004 | Hartzell et al. | |
| 6,839,240 B2 | 1/2005 | Skofljanec et al. | |
| 6,844,802 B2 | 1/2005 | Drummond et al. | |
| 6,943,293 B1 * | 9/2005 | Jeter et al. | 174/548 |
| 7,050,305 B2 | 5/2006 | Thorum | |
| 7,109,681 B2 | 9/2006 | Baker et al. | |
| 7,130,197 B2 | 10/2006 | Chin | |
| 7,164,584 B2 | 1/2007 | Walz | |
| 7,173,823 B1 | 2/2007 | Rinehart et al. | |
| 7,204,299 B2 | 4/2007 | Bhatti et al. | |
| 7,212,407 B2 | 5/2007 | Beihoff et | |
| 7,236,368 B2 * | 6/2007 | Maxwell et al. | 361/719 |
| 7,264,045 B2 | 9/2007 | Mehendale et al. | |
| 7,289,329 B2 | 10/2007 | Chen et al. | |
| 7,295,448 B2 * | 11/2007 | Zhu | 363/17 |
| 7,375,287 B2 * | 5/2008 | Rathmann | 174/260 |
| 7,375,974 B2 * | 5/2008 | Kirigaya | 361/752 |
| 7,471,534 B2 * | 12/2008 | Andersson et al. | 363/141 |
| 7,479,020 B2 | 1/2009 | Whitton | |
| 7,554,817 B2 * | 6/2009 | Nakakita et al. | 361/775 |
| 7,579,805 B2 | 8/2009 | Saito et al. | |
| 7,646,606 B2 | 1/2010 | Rytka et al. | |
| 7,660,099 B2 | 2/2010 | Imamura et al. | |
| 7,710,723 B2 | 5/2010 | Korich et al. | |
| 7,726,440 B2 | 6/2010 | Aisenbrey | |
| 7,742,303 B2 | 6/2010 | Azuma et al. | |
| 7,788,801 B2 | 9/2010 | Oggioni et al. | |
| 7,791,887 B2 | 9/2010 | Ganev et al. | |
| 7,798,833 B2 | 9/2010 | Holbrook | |
| 7,800,257 B2 | 9/2010 | Lu | |
| 7,804,688 B2 | 9/2010 | Wakabayashi et al. | |
| 7,864,506 B2 | 1/2011 | Pal et al. | |
| 7,869,714 B2 | 1/2011 | Patel et al. | |
| 7,907,385 B2 | 3/2011 | Korich et al. | |
| 7,920,039 B2 | 4/2011 | Shabany et al. | |
| 7,952,225 B2 | 5/2011 | Reichard et al. | |
| 7,952,876 B2 | 5/2011 | Azuma et al. | |
| 7,957,166 B2 | 6/2011 | Schnetzka et al. | |
| 7,974,101 B2 | 7/2011 | Azuma et al. | |
| 8,040,005 B2 | 10/2011 | Bhatti | |
| 8,064,198 B2 | 11/2011 | Higashidani et al. | |
| 8,064,234 B2 | 11/2011 | Tokuyama et al. | |
| 8,072,758 B2 | 12/2011 | Groppo et al. | |
| 8,098,479 B1 | 1/2012 | Parler, Jr. et al. | |
| 8,110,415 B2 | 2/2012 | Knickerbocker et al. | |
| 8,169,780 B2 | 5/2012 | Yoshino et al. | |
| 8,376,069 B2 | 2/2013 | Nakatsu et al. | |
| 8,416,574 B2 | 4/2013 | Tokuyama et al. | |
| 8,422,230 B2 | 4/2013 | Aiba et al. | |
| 8,582,291 B2 | 11/2013 | Nakasaka et al. | |
| 8,582,294 B2 | 11/2013 | Guerin et al. | |
| 8,654,527 B2 | 2/2014 | Wei et al. | |
| 8,665,596 B2 * | 3/2014 | Brereton | 361/704 |
| 8,675,364 B2 | 3/2014 | Tokuyama et al. | |
| 2002/0106414 A1 | 8/2002 | Gernert | |
| 2002/0130495 A1 | 9/2002 | Lotspih et al. | |
| 2003/0053298 A1 | 3/2003 | Yamada et al. | |
| 2005/0263273 A1 | 12/2005 | Crumly | |
| 2007/0240867 A1 | 10/2007 | Amano et al. | |
| 2007/0246191 A1 | 10/2007 | Behrens et al. | |
| 2008/0117602 A1 | 5/2008 | Korich et al. | |
| 2010/0078807 A1 | 4/2010 | Schulz | |
| 2010/0081191 A1 | 4/2010 | Woods | |
| 2010/0157640 A1 | 6/2010 | Azuma et al. | |
| 2010/0254093 A1 * | 10/2010 | Oota et al. | 361/720 |
| 2010/0328883 A1 | 12/2010 | Ledezma et al. | |
| 2010/0328893 A1 | 12/2010 | Higashidani et al. | |
| 2011/0116235 A1 | 5/2011 | Ryu et al. | |
| 2011/0214629 A1 | 9/2011 | Benoit | |
| 2011/0235276 A1 | 9/2011 | Hentschel et al. | |
| 2011/0267778 A1 | 11/2011 | Eckstein et al. | |
| 2012/0031598 A1 | 2/2012 | Han et al. | |
| 2012/0206950 A1 | 8/2012 | Duppong et al. | |
| 2013/0039009 A1 | 2/2013 | Shin et al. | |
| 2013/0044434 A1 | 2/2013 | Sharaf et al. | |
| 2013/0170269 A1 | 7/2013 | Sharaf et al. | |
| 2013/0215573 A1 | 8/2013 | Wagner et al. | |
| 2013/0223009 A1 | 8/2013 | Nakatsu et al. | |
| 2013/0258596 A1 | 10/2013 | Sharaf et al. | |
| 2014/0069615 A1 | 3/2014 | Kusaka | |

FOREIGN PATENT DOCUMENTS

| | | | |
|---|---|---|---|
| CN | 101981638 | 2/2011 | |
| CN | 102013319 | 4/2011 | |
| DE | 102007054618 A1 | 6/2008 | |
| DE | 102008033473 A1 | 5/2009 | |
| EP | 1028439 | 8/2000 | |
| EP | 1484774 | 12/2004 | |
| FR | 2903057 | 1/2008 | |
| JP | 4256397 | 9/1992 | |
| JP | 07297043 | 11/1995 | |
| JP | 2004254358 A | 9/2004 | |
| JP | 2007273774 | 10/2007 | |
| JP | 2008078350 | 4/2008 | |
| JP | 2011182500 A * | 9/2011 | H02M 3/28 |
| WO | 2010/144399 | 12/2010 | |
| WO | 2010144399 | 12/2010 | |
| WO | 2011/138156 | 11/2011 | |
| WO | 2011138156 | 11/2011 | |

\* cited by examiner

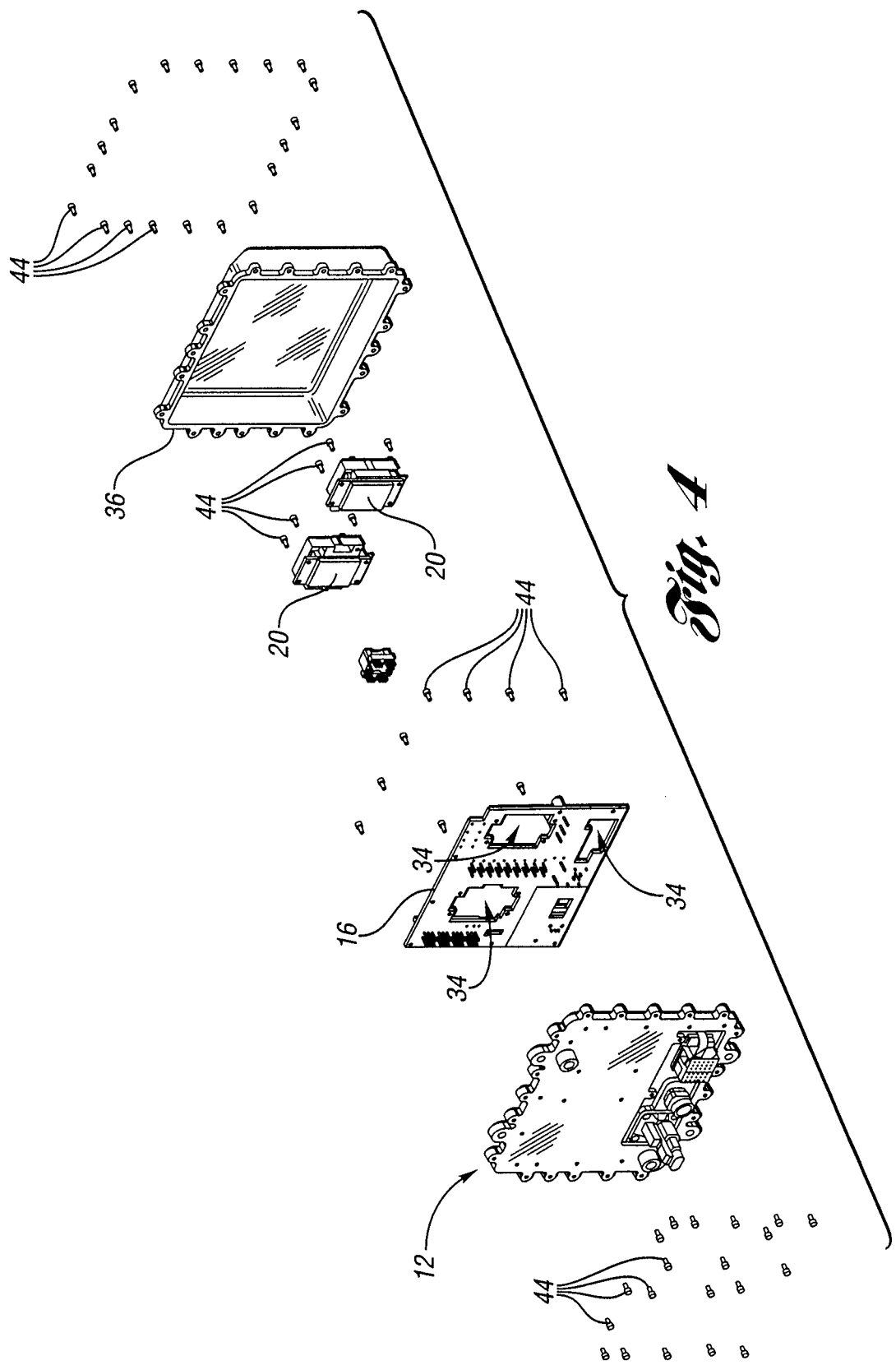

COLDPLATE FOR USE IN AN ELECTRIC VEHICLE (EV) OR A HYBRID-ELECTRIC VEHICLE (HEV)

TECHNICAL FIELD

The following relates to a coldplate for use in an electric vehicle (EV) or a hybrid-electric vehicle (HEV).

BACKGROUND

Automotive vehicles powered by an electric motor or an electric motor and a gasoline engine are commonly referred to as electric vehicles (EV) or hybrid-electric vehicles (HEV). As is well known in the art, such vehicles include batteries for supplying power to the electric motors thereof.

Electric and hybrid-electric vehicles typically provide for charging such batteries using an interface configured to rectify electrical power from a 120 volt or 240 volt alternating current (AC) utility power line for storage by the vehicle batteries. EVs and HEVs also include an inverter for use in converting the direct current (DC) voltage provided by the vehicle batteries to an AC voltage for use in powering the electric motor or motors of the vehicle. Such an inverter may comprise switching modules and a DC link capacitor.

In addition, electric and hybrid-electric vehicles may also include an auxiliary power module. Such a power module may comprise a number of electronic components, which may include transformers, capacitors, bus bars, metal-oxide-semiconductor field-effect transistors (MOSFETs) and other components.

The components of such an auxiliary power module generate heat as a result of their operations. The heat generated as a result of such operations should be dissipated so that the power module may continue to operate efficiently. Such heat generated by the operation of the power modules components may be dissipated using a coldplate provided as part of the module.

In that regard, an exemplary power converter for use in electric or hybrid-electric vehicles is shown in U.S. Pat. No. 7,974,101 entitled "Power Converter." Exemplary heat dissipating devices, as well as various features thereof, are shown in U.S. Pat. No. 7,864,506 entitled "System And Method Of Film Capacitor Cooling," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

However, due to the heat generated as a result of the operation of auxiliary power modules used in an EV or HEV, there exists a need for additional heat dissipation beyond that which may be provided by standard coldplates currently in use with an EV or HEV auxiliary power module. Such a coldplate would include protrusions configured to contact one or more electronic components of the auxiliary power module in order to provide for additional dissipation of the heat generated by operation of that power module.

SUMMARY

According to one embodiment disclosed herein, a coldplate is provided for use with electronic components in an electric vehicle (EV) or a hybrid-electric vehicle (HEV). The coldplate comprises a main portion having a plurality of raised features on a surface thereof. The raised features are configured for attaching the main portion to a printed circuit board having a plurality of electronic components attached thereto. The raised features are further configured for maintaining the printed circuit board in a spaced relation relative to the main portion to facilitate air flow between the printed circuit board and the main portion for dissipating heat generated by the plurality of electronic components.

The coldplate further comprises a protrusion extending from the surface of the main portion. The protrusion is configured for contacting one of the plurality of electronic components attached to the printed circuit board for dissipating heat generated by the electronic component.

According to another embodiment disclosed herein, a heat sink is provided for use with electronic components in an electric vehicle (EV) or a hybrid-electric vehicle (HEV). The heat sink comprises a main portion having a plurality of raised features on a surface thereof. The raised features are configured for attaching the main portion to a printed circuit board having a plurality of electronic components attached thereto. The raised features are further configured for maintaining the printed circuit board in a spaced relation relative to the main portion to facilitate air flow between the printed circuit board and the main portion for dissipating heat generated by the plurality of electronic components.

In this embodiment, the heat sink further comprises a plurality of protrusion extending from the surface of the main portion. The plurality of protrusion are configured for contacting the plurality of electronic components attached to the printed circuit board for dissipating heat generated by the electronic components. One of the plurality of protrusions comprises a substantially plate-like member extending substantially perpendicularly from the surface of the main portion.

Another of the plurality of protrusion defines a recess having a floor and a plurality of walls. The recess is configured for receiving a transformer having a bottom surface and a plurality of side surfaces. The floor of the recess is configured for contacting the bottom surface of the transformer and the walls of the recess configured for contacting the plurality of side surfaces of transformer for dissipating heat generated by the transformer.

According to a further embodiment disclosed herein, a heat sink is provided for use with electronic components in an electric vehicle (EV) or a hybrid-electric vehicle (HEV). The heat sink comprises a main portion having a plurality of raised features on a surface thereof. The raised features are configured for attaching the main portion to a printed circuit board having a plurality of electronic components attached thereto. The raised features are further configured for maintaining the printed circuit board in a spaced relation relative to the main portion to facilitate air flow between the printed circuit board and the main portion for dissipating heat generated by the plurality of electronic components.

The heat sink further comprises a protrusion extending from the surface of the main portion. The protrusion is configured for contacting one of the plurality of electronic components attached to the printed circuit board for dissipating heat generated by the electronic component. The protrusion comprises a substantially plate-like member extending substantially perpendicularly from the surface of the main portion and configured for extending through an opening formed in the printed circuit board.

A detailed description of these embodiments of a coldplate for use in an electric vehicle (EV) or a hybrid-electric vehicle (HEV) are set forth below together with accompanying drawings.

BRIEF DESCRIPTION OF THE DRAWINGS

FIG. 4 is an exploded view of the coldplate of FIG. 3, together with various electronic components and a housing therefor, as disclosed herein.

DETAILED DESCRIPTION

Figure 1A:
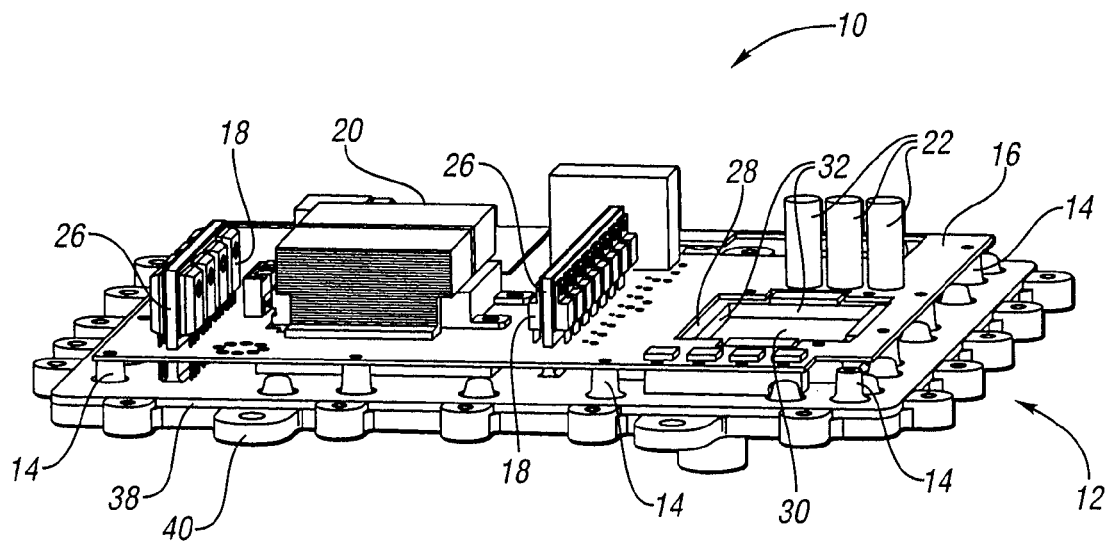
FIGS. 1A and 1B are perspective views of a coldplate for use in an electric vehicle (EV) or a hybrid-electric vehicle (HEV), the coldplate having protrusions for use in dissipating heat generated by electronic components, as disclosed herein.

With reference to FIGS. 1-4, a more detailed description of embodiments of a coldplate for use in an electric vehicle (EV) or a hybrid-electric vehicle (HEV) will be described. For ease of illustration and to facilitate understanding, like reference numerals have been used herein for like components and features throughout the drawings.

As noted above, electric and hybrid-electric vehicles may include an auxiliary power module. Such a power module may comprise a number of electronic components, which may include transformers, capacitors, bus bars, metal-oxide-semiconductor field-effect transistors (MOSFETs) and other components.

The components of such an auxiliary power module generate heat as a result of their operations. The heat generated as a result of such operations should be dissipated so that the power module may continue to operate efficiently. Such heat generated by the operation of the power modules components may be dissipated using a coldplate provided as part of the module.

Exemplary heat dissipating devices, as well as various features thereof, are shown in U.S. Pat. No. 7,864,506 entitled "System And Method Of Film Capacitor Cooling," U.S. Pat. No. 6,529,394 entitled "Inverter For An Electric Motor," U.S. Pat. No. 6,466,441 entitled "Cooling Device Of Electronic Part Having High And Low Heat Generating Elements," U.S. Pat. No. 6,031,751 entitled "Small Volume Heat Sink/Electronic Assembly," U.S. Patent Application Publication No. 2010/0081191 entitled "Anisotropic Heat Spreader For Use With A Thermoelectric Device," and U.S. Patent Application Publication No. 2010/0078807 entitled "Power Semiconductor Module Assembly With Heat Dissipating Element."

There exists a need, however, for additional heat dissipation beyond that which may be provided by standard coldplates currently in use with an EV or HEV auxiliary power module. Such a coldplate would include protrusions configured to contact one or more electronic components of the auxiliary power module in order to provide for additional dissipation of the heat generated by operation of that power module.

Figure 1B:
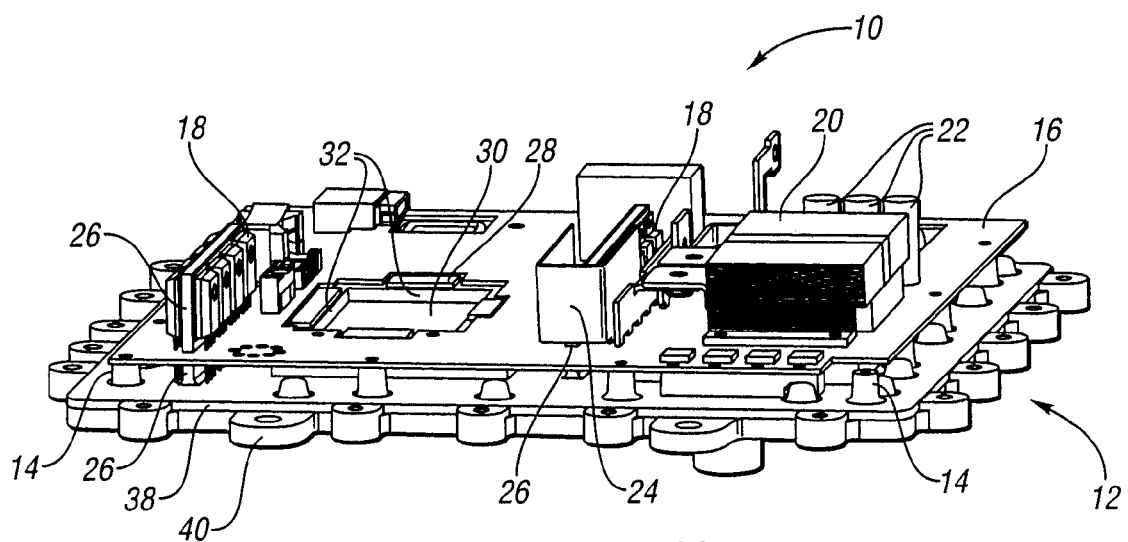

Referring now to FIGS. 1A and 1B, perspective views of a coldplate or heat sink for use in an electric vehicle (EV) or a hybrid-electric vehicle (HEV) are shown, denoted generally by reference numeral (10). As seen therein, the coldplate (10) may comprise a main portion (12), which may have a substantially plate-like shape, although other shapes may also be employed.

The main portion (12) may comprise multiple raised features (14) on a surface of the main portion (12). The raised features (14) may be configured for attaching the main portion (12) to a printed circuit board (16) having a plurality of electronic components attached thereto, such as metal-oxide-semiconductor field-effect transistors (MOSFET) (18), transformer (20), capacitors (22), bus bars (24) and/or other components.

The raised features (14) may be further configured for maintaining the printed circuit board (16) in a spaced relation relative to the main portion (12). In such a fashion, the raised features (14) may facilitate air flow between the printed circuit board (16) and the main portion (12) for dissipating heat generated by the electronic components (18, 20, 22, 24).

The coldplate (10) may also comprise one or more protrusions (26, 28) extending from the surface of the main portion (12). The protrusions (26) may be configured for contacting one or more of the electronic components (18, 20, 22, 24) attached to the printed circuit board (16) for dissipating heat generated by the electronic components (18, 20, 22, 24).

As seen in FIG. 1A, the protrusions (26) may comprise substantially plate-like members extending substantially perpendicularly from the surface of the main portion (12) of the coldplate (10) and configured for contacting MOSFET (18). In that regard, the MOSFET (18) may comprise at least one substantially planar surface, and the protrusion (26) may comprises a contact surface having an area configured for contacting substantially all of the surface of the MOSFET (18) for dissipating heat generated by the MOSFET (18).

Similarly, as seen in FIG. 1B, the protrusions (26) may comprises substantially plate-like member extending substantially perpendicularly from the surface of the main portion (12) of the coldplate (10) and configured for contacting MOSFET (18) and bus bars (24). In that regard, the bus bars (24) may comprise at least one surface, and the protrusion (26) may comprises a contact surface having an area configured for contacting the surface of the bus bars (24) for dissipating heat generated by the bus bars (24).

Still referring to FIGS. 1A and 1B, the protrusion (28) may define a recess having a floor (30) and a plurality of walls (32). The recess may be configured for receiving a transformer (20). As seen therein, the floor (30) of the recess may be configured for contacting a bottom surface of the transformer (20) and the plurality of walls (32) of the recess may be configured for contacting a plurality of side surfaces of the transformer (20) for dissipating heat generated by the transformer (20).

Figure 2:
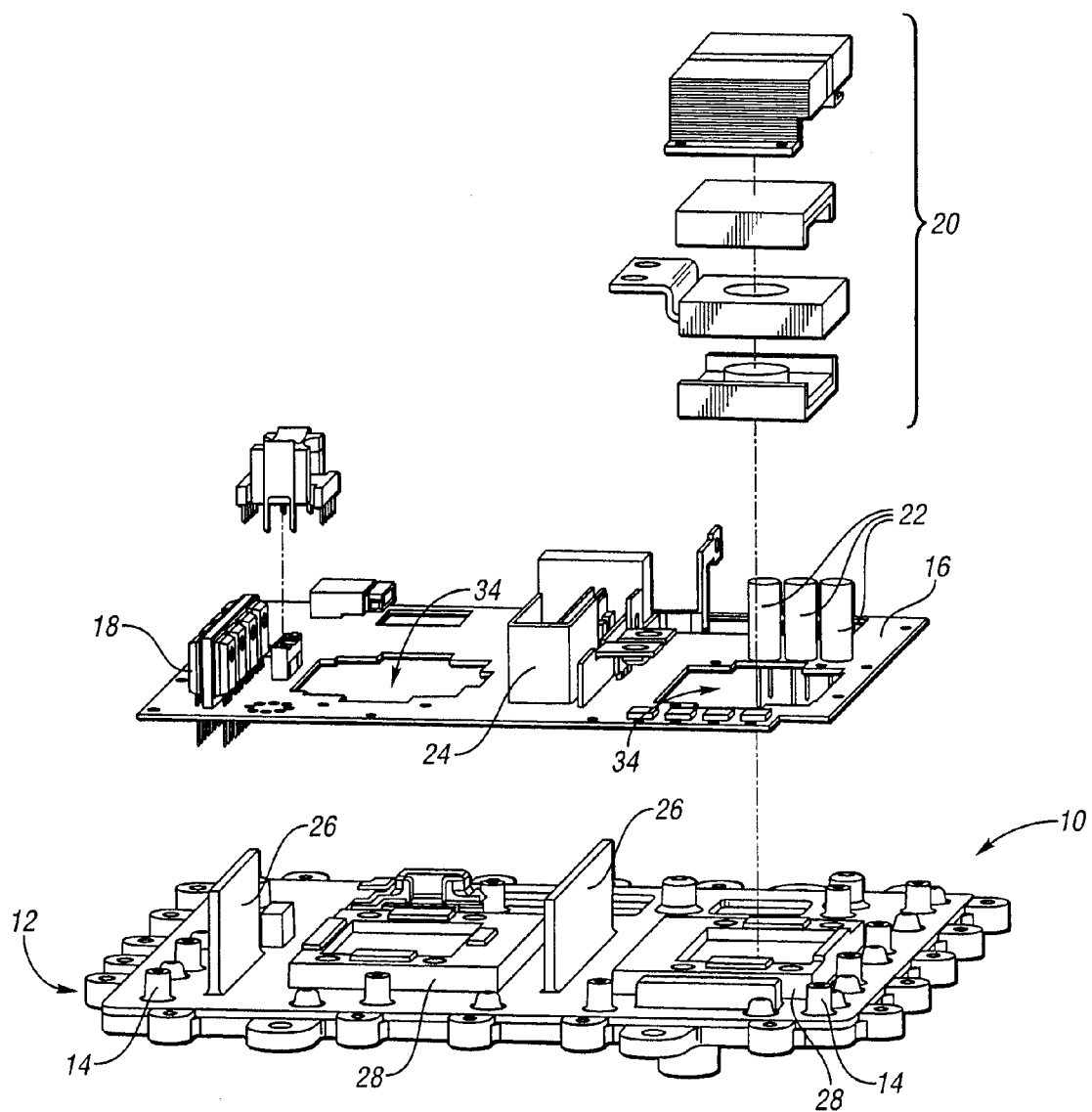
FIG. 2 is an exploded view of the coldplate of FIGS. 1A and 1B for use in an EV or HEV, together with various electronic components, as disclosed herein.

Referring now to FIG. 2, an exploded view of the coldplate (10) of FIGS. 1A and 1B for use in an EV or HEV is shown, together with various electronic components (16, 18, 22, 24) including an exploded view of a transformer (20). As seen therein, the printed circuit board (16) may be provided with openings (34). In that regard, the protrusion (26, 28) extending from the surface of the main portion (12) may be configured for extending through the openings (34) formed in the printed circuit board (16).

Upon attachment of the printed circuit board (16) to the main portion (12) of the coldplate (10) at raised features (14), each of the recesses defined by protrusions (28) and the substantially plate-like members of protrusions (26) may be oriented for substantial alignment with an opening (34) formed in the printed circuit board (16). The openings (34) are also formed and aligned to facilitate cooperation between the protrusions (26, 29) and corresponding electronic components (18, 20, 22, 24), such as between the substantially plate-like members of protrusions (26) and the MOSFETs (18) and bus bars (24), as well as between the recesses defined by protrusions (28) and the transformers (20).

Figure 3:
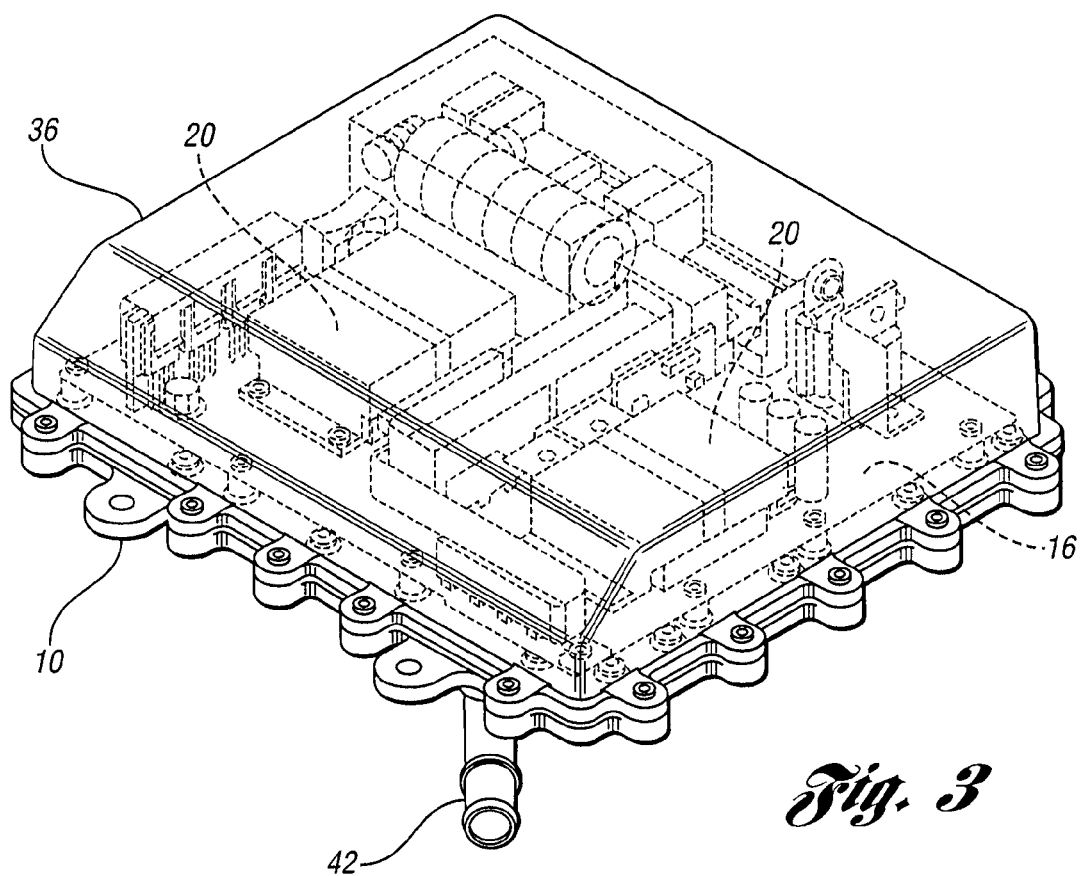
FIG. 3 is a perspective view of the coldplate of FIGS. 1A and 1B for use in an EV or HEV, together with various electronic components and a housing therefor, as disclosed herein.

Referring next to FIG. 3, a perspective view of the coldplate (10) of FIGS. 1A and 1B for use in an EV or HEV, is shown, together with various electronic components (16, 18, 20) As seen therein, a housing (36) (rendered transparent) may be provided for attachment to the coldplate (10) in order to cover and provide protection for printed circuit board (16) and electronic components such as MOSFET (18), transformers (20) and others. The housing (36) may comprise a plastic or other suitable material known in the art.

As also seen in FIG. 3, and with continuing reference to FIGS. 1A and 1B, the main portion (12) of coldplate (10) may comprise an upper member (38) and a lower member (40) which may be configured to define a chamber or manifold (not shown) therebetween. To further facilitate heat dissipation, a coolant of any type known in the art may be circulated through the chamber or manifold formed by the upper and lower members (38, 40) of the main portion (12) between a coolant inlet (42) and a coolant outlet (not shown).

Referring next to FIG. 4, an exploded view of the coldplate (10) of FIG. 3 is shown, together with various electronic components (16, 18, 20) and a housing (36) therefor. In that regard, FIG. 4 again illustrates the openings (34) defined by the printed circuit board (16) and configured to allow the protrusions (26, 28) to extend therethrough for contacting the electronic components (18, 20, 22, 24) for dissipating heat generated by those components (18, 20, 22, 24). As seen therein, the coldplate (10), printed circuit board (16) and other electronic components (18, 20, 22, 24), and housing (36) may be attached using any type of known fasteners including screws, bolts or other fastener types or means.

As is readily apparent from the foregoing, a coldplate for use in an electric vehicle (EV) or a hybrid-electric vehicle (HEV) has been described. The embodiments of the coldplate described provide for additional heat dissipation beyond that which may be supplied by a standard coldplate used with an EV or HEV auxiliary power module. Such embodiments include a coldplate having protrusions configured to contact one or more electronic components used in an auxiliary power module in order to provide for additional dissipation of the heat generated by operation of the components of the auxiliary power module, thereby providing for efficient operation of the module.

While various embodiments of a coldplate for use in an electric vehicle (EV) or a hybrid-electric vehicle (HEV) have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A coldplate for use with electronic components in an electric vehicle (EV) or a hybrid-electric vehicle (HEV), the coldplate comprising:
    a main portion having a plurality of raised features on a surface thereof, the raised features configured for attaching the main portion to a printed circuit board having a plurality of electronic components attached thereto, the raised features further configured for maintaining the printed circuit board in a spaced relation relative to the main portion to facilitate air flow between the printed circuit board and the main portion for dissipating heat generated by the plurality of electronic components; and
    a protrusion extending from the surface of the main portion, the protrusion configured for contacting one of the plurality of electronic components attached to the printed circuit board for dissipating heat generated by the electronic component.

2. The coldplate of claim 1 wherein the protrusion extending from the surface of the main portion is configured for extending through an opening formed in the printed circuit board.

3. The coldplate of claim 1 wherein the protrusion comprises a substantially plate-like member extending substantially perpendicularly from the surface of the main portion.

4. The coldplate of claim 1 wherein the protrusion defines a recess having a floor and a plurality of walls, the recess configured for receiving a transformer having a bottom surface and a plurality of side surfaces, the floor of the recess configured for contacting the bottom surface of the transformer and the walls of the recess configured for contacting the plurality of side surfaces of transformer for dissipating heat generated by the transformer.

5. The coldplate of claim 1 wherein the recess is oriented for substantial alignment with an opening formed in the printed circuit board.

6. The coldplate of claim 2 wherein the one of the plurality of electronic components comprises a MOSFET having a surface, and wherein the protrusion comprises a contact surface having an area configured for contacting substantially all of the surface of the MOSFET for dissipating heat generated by the MOSFET.

7. The coldplate of claim 3 wherein the one of the plurality of electronic components comprises a MOSFET having a substantially planar surface, and wherein the protrusion comprises a contact surface having an area configured for contacting substantially all of the surface of the MOSFET for dissipating heat generated by the MOSFET.

8. The coldplate of claim 2 wherein the one of the plurality of electronic components comprises a bus bar having a surface, and wherein the protrusion comprises a contact surface having an area configured for contacting the surface of the bus bar for dissipating heat generated by the bus bar.

9. The coldplate of claim 3 wherein the one of the plurality of electronic components comprises a bus bar having a substantially planar surface, and wherein the protrusion comprises a contact surface having an area configured for contacting the surface of the bus bar for dissipating heat generated by the bus bar.

10. A heat sink for use with electronic components in an electric vehicle (EV) or a hybrid-electric vehicle (HEV), the heat sink comprising:
    a main portion having a plurality of raised features on a surface thereof, the raised features configured for attaching the main portion to a printed circuit board having a plurality of electronic components attached thereto, the raised features further configured for maintaining the printed circuit board in a spaced relation relative to the main portion to facilitate air flow between the printed circuit board and the main portion for dissipating heat generated by the plurality of electronic components; and
    a plurality of protrusion extending from the surface of the main portion, the plurality of protrusion configured for contacting the plurality of electronic components attached to the printed circuit board for dissipating heat generated by the electronic components;
    wherein one of the plurality of protrusions comprises a substantially plate-like member extending substantially perpendicularly from the surface of the main portion, and another of the plurality of protrusion defines a recess having a floor and a plurality of walls, the recess configured for receiving a transformer having a bottom surface and a plurality of side surfaces, the floor of the recess configured for contacting the bottom surface of the transformer and the walls of the recess configured for contacting the plurality of side surfaces of transformer for dissipating heat generated by the transformer.

11. The heat sink of claim 10 wherein the protrusion extending from the surface of the main portion is configured for extending through an opening formed in the printed circuit board.

12. The heat sink of claim 10 wherein the recess is oriented for substantial alignment with an opening formed in the printed circuit board.

13. The heat sink of claim 10 wherein the one of the plurality of electronic components comprises a MOSFET having a substantially planar surface, and wherein the protrusion comprises a contact surface having an area configured for contacting substantially all of the surface of the MOSFET for dissipating heat generated by the MOSFET.

14. The heat sink of claim 10 wherein the one of the plurality of electronic components comprises a bus bar having a substantially planar surface, and wherein the protrusion comprises a contact surface having an area configured for contacting the surface of the bus bar for dissipating heat generated by the bus bar.

15. The heat sink of claim 10 wherein the main portion has a substantially plate-like shape.

16. A heat sink for use with electronic components in an electric vehicle (EV) or a hybrid-electric vehicle (HEV), the heat sink comprising:
a main portion having a plurality of raised features on a surface thereof, the raised features configured for attaching the main portion to a printed circuit board having a plurality of electronic components attached thereto, the raised features further configured for maintaining the printed circuit board in a spaced relation relative to the main portion to facilitate air flow between the printed circuit board and the main portion for dissipating heat generated by the plurality of electronic components; and
a protrusion extending from the surface of the main portion, the protrusion configured for contacting one of the plurality of electronic components attached to the printed circuit board for dissipating heat generated by the electronic component;
wherein the protrusion comprises a substantially plate-like member extending substantially perpendicularly from the surface of the main portion and configured for extending through an opening formed in the printed circuit board.

17. The heat sink of claim 16 further comprising another protrusion defining a recess having a floor and a plurality of walls, the recess configured for receiving a transformer having a bottom surface and a plurality of side surfaces, the floor of the recess configured for contacting the bottom surface of the transformer and the walls of the recess configured for contacting the plurality of side surfaces of transformer for dissipating heat generated by the transformer.

18. The heat sink of claim 16 wherein the recess is oriented for substantial alignment with an opening formed in the printed circuit board.

19. The heat sink of claim 16 wherein the one of the plurality of electronic components comprises a MOSFET having a substantially planar surface, and wherein the protrusion comprises a contact surface having an area configured for contacting substantially all of the surface of the MOSFET for dissipating heat generated by the MOSFET.

20. The heat sink of claim 16 wherein the one of the plurality of electronic components comprises a bus bar having a substantially planar surface, and wherein the protrusion comprises a contact surface having an area configured for contacting the surface of the bus bar for dissipating heat generated by the bus bar.

* * * * *

UNITED STATES PATENT AND TRADEMARK OFFICE
CERTIFICATE OF CORRECTION

PATENT NO. : 8,971,038 B2
APPLICATION NO. : 13/477652
DATED : March 3, 2015
INVENTOR(S) : Sharaf et al.

Page 1 of 1

It is certified that error appears in the above-identified patent and that said Letters Patent is hereby corrected as shown below:

In the Claims

Column 6, Line 61, Claim 10:

After "a plurality of"
Delete "protrusion" and
Insert -- protrusions --.

Column 7, Line 2, Claim 10:

After "a plurality of"
Delete "protrusion" and
Insert -- protrusions --.

Signed and Sealed this
Thirtieth Day of June, 2015

Michelle K. Lee
*Director of the United States Patent and Trademark Office*